United States Patent
Kim

(10) Patent No.: US 10,485,116 B2
(45) Date of Patent: Nov. 19, 2019

(54) FOLDABLE DISPLAY DEVICE

(71) Applicant: LG DISPLAY CO., LTD., Seoul (KR)

(72) Inventor: Jun-Hyung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/223,527

(22) Filed: Dec. 18, 2018

(65) Prior Publication Data

US 2019/0200466 A1 Jun. 27, 2019

(30) Foreign Application Priority Data

Dec. 27, 2017 (KR) .................. 10-2017-0180866

(51) Int. Cl.
*H05K 5/00* (2006.01)
*H05K 5/02* (2006.01)

(52) U.S. Cl.
CPC ......... *H05K 5/0017* (2013.01); *H05K 5/0226* (2013.01)

(58) Field of Classification Search
CPC ..................... H05K 5/0017; H05K 5/0226
See application file for complete search history.

(56) References Cited

U.S. PATENT DOCUMENTS

| | | | | |
|---|---|---|---|---|
| 2011/0247863 A1* | 10/2011 | Watanabe | ............. | H05K 1/028 174/254 |
| 2014/0098513 A1* | 4/2014 | Yi | ............. | G02B 5/003 362/19 |
| 2015/0043187 A1* | 2/2015 | Lee | ............. | H05K 1/028 361/784 |
| 2015/0173176 A1* | 6/2015 | Lee | ............. | H05K 1/0259 361/749 |
| 2015/0234513 A1* | 8/2015 | Jiang | ............. | G06F 3/0412 345/174 |
| 2016/0026297 A1* | 1/2016 | Shinkai | ............. | G06F 3/044 345/174 |
| 2016/0302314 A1* | 10/2016 | Bae | ............. | G06F 1/16 |

* cited by examiner

*Primary Examiner* — Rockshana D Chowdhury
(74) *Attorney, Agent, or Firm* — Birch, Stewart, Kolasch & Birch, LLP

(57) ABSTRACT

A foldable display device is discussed, which is capable of shielding the folding region of a housing, to which a flexible display panel is coupled, so as to prevent exposure of the folding region to the outside upon an operation of folding the housing, and which is capable of improving the flatness of the flexible display panel when the flexible display panel or the housing returns from the folded state to the unfolded state.

4 Claims, 5 Drawing Sheets

(a)

(b)

FOLDABLE DISPLAY DEVICE

CROSS-REFERENCE TO RELATED APPLICATION

This application claims the priority benefit of Korean Patent Application No. 10-2017-0180866, filed in the Republic of Korea on Dec. 27, 2017, which is hereby incorporated by reference as if fully set forth herein.

BACKGROUND OF THE INVENTION

Field of the Invention

The present invention relates to a foldable display device including a display panel that is capable of being folded or unfolded when it is used.

Discussion of the Related Art

There are various kinds of display devices for displaying images, for example, liquid crystal display (LCD) devices, plasma display panel (PDP) devices, organic light-emitting diode (OLED) display devices, electrophoretic display (EPD) devices, etc.

Recently, studies on foldable display devices, which are bendable or foldable and can therefore be used in a greater variety of applications, have been actively conducted.

A foldable display device can be configured by connecting flat display panels, or can be configured to include a display panel having flexibility, that is, a flexible display panel.

A flexible display panel refers to a display panel that is pliable, bendable, foldable, or rollable like paper, while maintaining the display characteristics of general flat display panels.

The flexible display panel can be configured to include a plastic substrate that is deformable by external pressure.

The plastic substrate can have a structure in which a base film is coated on both surfaces thereof with a barrier coating. The base film can be formed of various kinds of resin such as, for example, polyimide (PI), polycarbonate (PC), polyethylene terephthalate (PET), polyethersulfone (PES), polyethylene naphthalate (PEN), or fiber-reinforced plastic (FRP). The barrier coating can be applied on two opposite surfaces of the base film. An organic film or an inorganic film can be used as the barrier coating in order to maintain flexibility.

The flexible display panel is capable of being rolled or folded into various shapes due to its flexibility. A flexible display device, to which the flexible display panel is applied, requires a case for protecting the flexible display panel and various other components accommodated in the case. Thus, the flexible display device faces many problems that should be overcome in order to realize deformability by which the entire display device is capable of being deformed or shaped into any desired shape.

On the other hand, a foldable display device can be configured to be folded and unfolded with a relatively simple mechanical structure.

The foldable display device generally includes a flexible display panel and a housing for allowing the flexible display panel to be maintained in a predetermined shape or at a predetermined folding angle.

In order to allow the flexible display panel to be maintained in a predetermined shape or at a predetermined folding angle, the housing of the foldable display device includes a hinge mechanism, by which the housing is folded at a portion thereof corresponding to the folding region of the flexible display panel. In general, the housing includes two flat plates that are hinged to each other by a central hinge, and realizes a folding operation through pivoting movement of the two flat plates about the hinge.

However, when the two flat plates of the housing pivot about the hinge for the folding operation, the ends of the two flat plates, which are contiguous to and face each other in the unfolded state, move away from each other during the folding operation, and thus the folding region of the housing becomes partially open when the folding operation is completed.

SUMMARY OF THE INVENTION

Accordingly, the present invention is directed to a foldable display device that substantially obviates one or more problems due to limitations and disadvantages of the related art.

An object of the present invention is to provide a foldable display device that is capable of shielding the folding region of a housing, to which a flexible display panel is coupled, so as to prevent exposure of the folding region to the outside upon an operation of folding the housing and that is capable of improving the flatness of the flexible display panel when the flexible display panel or the housing returns from the folded state to the unfolded state.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a foldable display device includes a sub-frame, which is provided at a position corresponding to the folding region of a flexible display panel and the folding region of a housing, thereby preventing the folding region of the housing from being exposed to the outside when the housing is folded, and thereby improving the flatness of the folding region of the flexible display panel when transitioning from the folded state to the unfolded state.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
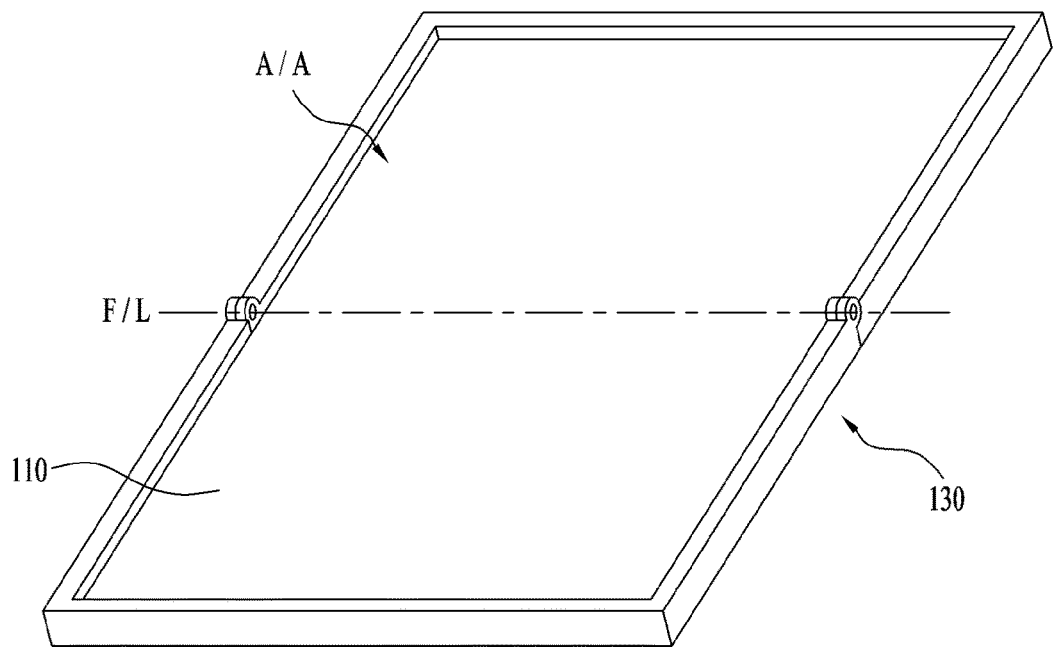
FIG. 1 is a perspective view illustrating a foldable display device according to an embodiment of the present invention.

Reference will now be made in detail to the preferred embodiments of the present invention, examples of which are illustrated in the accompanying drawings. In the drawings, the same or similar elements are denoted by the same reference numerals even when they are depicted in different drawings. In the following description of the present invention, a detailed description of known functions or known configurations incorporated herein will be omitted when it may make the subject matter of the present invention rather unclear. Some features illustrated in the drawings are exaggerated, reduced or simplified for convenience in description and clarity, and the drawings and elements in the drawings are not always illustrated at the actual scale. However, these details will be easily understood by those skilled in the art.

Figure 2:
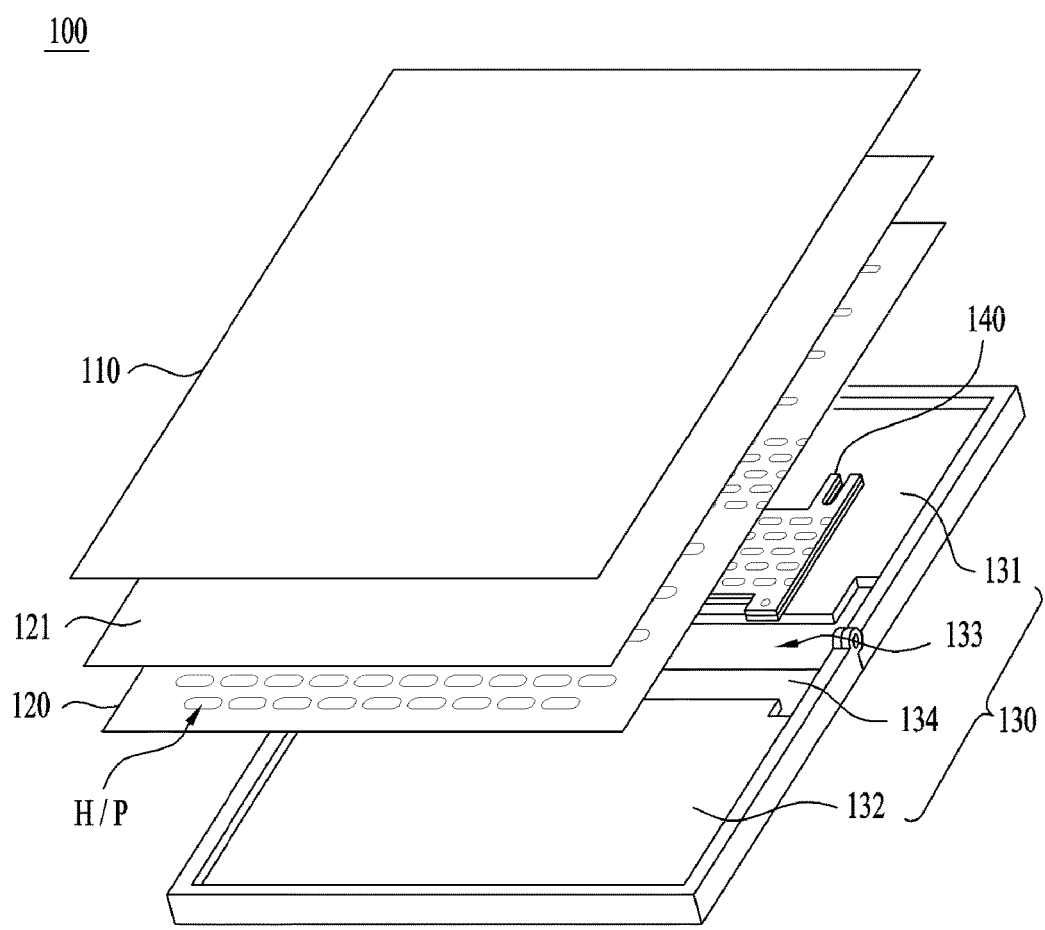
FIG. 2 is an exploded perspective view illustrating the coupling structure of the foldable display device shown in FIG. 1.

FIG. 1 is a perspective view illustrating a foldable display device according to an embodiment of the present invention. FIG. 2 is an exploded perspective view illustrating the coupling structure of the foldable display device shown in FIG. 1. All the components of the foldable display devices according to all embodiments of the present invention are operatively coupled and configured.

Referring to FIGS. 1 and 2, a foldable display device 100 according to the embodiment of the present invention includes a display panel 110 for displaying an image, a lower plate 120 coupled to the bottom surface of the display panel 110, a housing 130 coupled to the bottom surface of the lower plate 120, and a sub-frame 140 disposed between the lower plate 120 and the housing 130.

The display panel 110 is configured to be folded along a folding line F/L. Upon an actual folding operation, the display panel 110 is not sharply folded at a certain angle along the folding line F/L, but is folded in stages or in sequence with a predetermined curvature by a folding region 133 of the housing 130. Therefore, the folding line F/L is a line that passes through a predetermined folding region. Specifically, the folding line F/L, which is represented by the dotted line in FIG. 1, is an imaginary line that represents the center of the folding region, which is folded with a predetermined curvature upon the folding operation. The lower plate 120, the housing 130 and the sub-frame 140 are also folded together along the folding line F/L.

The display panel 110 can be embodied by a flexible display panel, which has pliable or bendable characteristics, or can be embodied by a rigid flat display panel, which is not easily deformed by external force and is maintained in a flat state.

In the case in which the display panel 110 is embodied by a flexible display panel, an organic light-emitting diode (OLED) display panel, an electrophoretic display (EPD) panel, or an electrochromic display (ECD) panel can be used as the flexible display panel.

In the case in which the display panel 110 is embodied by a flat display panel, in order to realize foldability, multiple flat display panels can be connected to each other so as to be physically folded relative to each other, or a single flat display panel can be configured to include a flexible portion formed therein, by which the flat display panel can be folded. A liquid crystal display (LCD) panel or a plasma display panel (PDP) can be used as the flat display panel. In the case of a foldable display device in which multiple flat display panels are connected to each other so as to be physically folded relative to each other, each of the flat display panels can be connected with a corresponding circuit unit.

The display panel 110 includes an active area A/A in which an image is displayed, and a non-active area which is located around the active area and in which no image is displayed. An extension line of a signal line and a bonding region, in which the extension line is connected to the circuit unit, can be provided in the non-active area. The circuit unit serves to apply an electrical signal for driving the display panel, and includes a substrate on which a circuit pattern in provided, and an integrated circuit (IC) chip which is mounted on the substrate. The substrate includes a main substrate on which the IC chip is mounted, and a connection substrate which connects the main substrate to the display panel. The main substrate can include a single-layered or multi-layered wiring pattern. The main substrate can be configured as a rigid printed circuit board (PCB) which is not easily bent or folded, or can be configured as a flexible printed circuit board (FPCB) which has flexibility. The connection substrate can include a single-layered or multi-layered wiring pattern, and can be configured to be easily bent or folded. The connection substrate can be configured as a flexible printed circuit board (FPCB), or can be configured to have a chip-on-film (COF) structure.

The non-active area is located along the edges of the top surface of the display panel 100, and the active area for displaying an image is located at a position further inward than the non-active area. The following description is given on the assumption that the foldable display device 100 of the present invention is of an inner folding type, by way of example, in which the active area is folded in the inward direction such that a portion thereof faces a remaining portion thereof. Various optical sheets or a protective film for protecting the display panel 110 can be additionally provided on the display panel 110.

As shown in FIG. 2, the lower plate 120 is coupled to the bottom surface of the display panel 110. The lower plate 120 coupled to the bottom surface of the display panel 110 prevents the display panel 110 from coming into direct contact with the surface of the housing 130. The sub-frame 140 is coupled to the bottom surface of the lower plate 120 in order to couple the display panel 110 and the lower plate 120 to the folding region 133 of the housing 130.

A skin layer 121 can be additionally provided between the display panel 110 and the lower plate 120. The skin layer 121 is configured as a thin shielding film, which prevents the components disposed under the bottom surface of the display panel 110 from being seen through the active area of the display panel 110. The skin layer 121 is formed of polyurethane (PU), silicon, polyethylene terephthalate (PET), or a rubber-based material. Therefore, the skin layer 121 can also serve to prevent damage attributable to friction, which can be generated between the display panel 110 and the lower plate 120 during the folding operation.

The skin layer 121 can be attached to the lower plate 120 using an adhesive, or can be formed on the lower plate 120 through a lamination method.

The lower plate 120 is configured as a thin plate that is formed of a metal material and has a size corresponding to the size of the display panel 110. The lower plate 120 serves to prevent the display panel 110 from being bent in undesired directions or at undesired angles. The lower plate 120 can also serve to dissipate heat from a heat emission portion. The lower plate 120 and the sub-frame 140, which is securely coupled to the bottom surface of the lower plate 120, stably support the display panel 110.

The lower plate 120 has a hole pattern H/P of holes formed over the entire surface of the lower plate 120. The size or number of holes, which constitute the hole pattern H/P, can vary locally or over the entire surface of the lower plate 120 depending on the desired elastic restoring force of the folding region of the lower plate 120.

Figure 3:
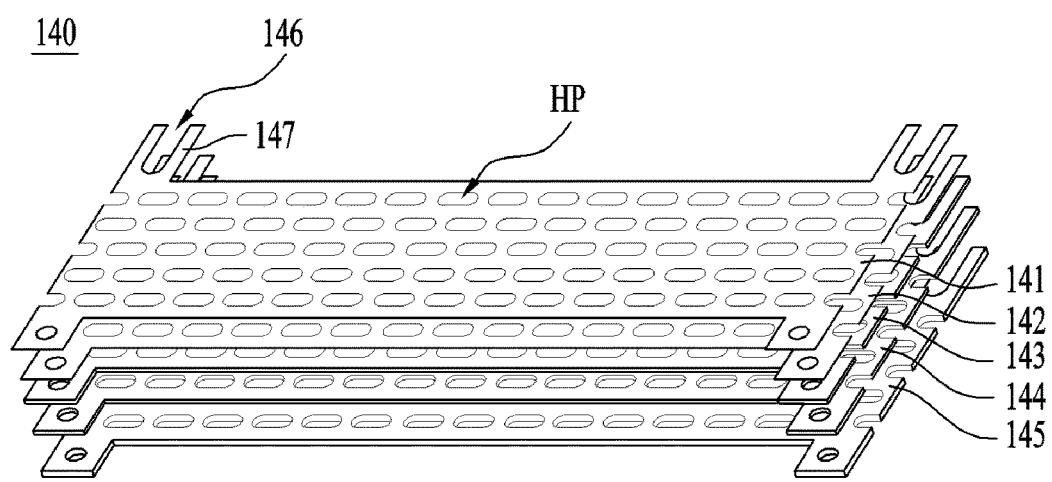
FIG. 3 is an enlarged perspective view illustrating a sub-frame of the foldable display device shown in FIG. 2.

The housing 130 can include several plates. For example, as shown in FIGS. 2 and 3, the housing 130 can include a first plate 131 which supports a portion of the bottom surface of the display panel 110, a second plate 132 which supports a remaining portion of the bottom surface of the display panel 110, and the folding region 133 which is defined by a hinge coupling between the first plate 131 and the second plate 132 and which corresponds to the folding region of the display panel 110. Therefore, the display panel 110 is folded and unfolded by the folding/unfolding operation of the folding region 133 of the housing 130.

The first plate 131 and the second plate 132 include respective planar regions, which have predetermined sizes for accommodating the display panel 110 and the lower plate 120. The first plate 131 and the second plate 132 also exhibit the function of a case for protecting the outer side of the display panel 110.

In order to prevent undesired sliding or slippage of a portion of the display panel 110 while the display panel 110 is folded on the top surface of the housing 130, structures for guiding sliding movement of a portion of the top surface or the side surfaces of the display panel 110 can be provided at the top surfaces of the first plate 131 and the second plate 132.

The folding region 133 of the housing 130 is folded in a manner such that the first plate 131 and the second plate 132, which are hinged to each other, pivot relative to each other. At this time, the display panel 110 is folded in stages or in sequence with a predetermined curvature by the folding operation of the folding region 133 of the housing 130. The following description of the embodiment of the present invention is given on the assumption that the first plate 131 and the second plate 132 have the same planar region as each other and that the folding region 133 is formed in the center of the housing 130. The position of the folding region 133, the direction in which the folding region 133 is formed, or the number of folding regions can vary depending on the construction of the display device 100. The hinge structure, by which the first plate 131 and the second plate 132 are connected to each other, cannot be located in the center of the housing 130, at which the end of the first plate 131 and the end of the second plate 132 face each other, but can be located at a position biased toward the display panel 110, whereby when the first plate 131 and the second plate 132 pivot relative to each other, the display panel 110 can be folded with a predetermined curvature within the regions of the first plate 131 and the second plate 132.

The housing 130 has a mounting recess 134 formed in the folding region 133 in which the sub-frame 140 is mounted. The shape or the depth of the mounting recess 134 can vary so as to correspond to the stacking structure or the thickness of the sub-frame 140.

Figure 4:
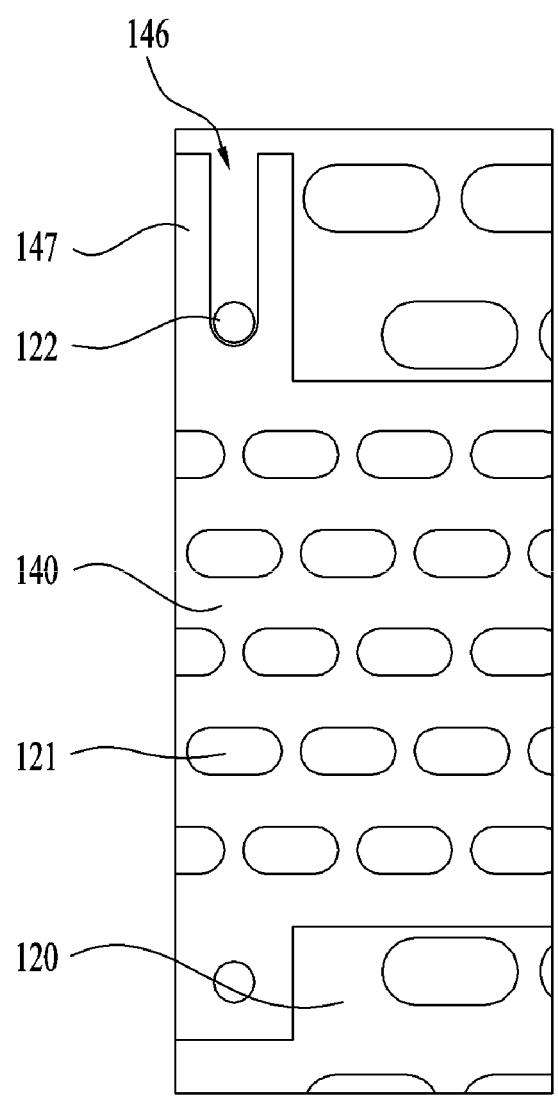
FIG. 4 is a bottom view partially illustrating the state in which the sub-frame is coupled to the bottom surface of a lower plate in the foldable display device shown in FIG. 2.
Figure 5:
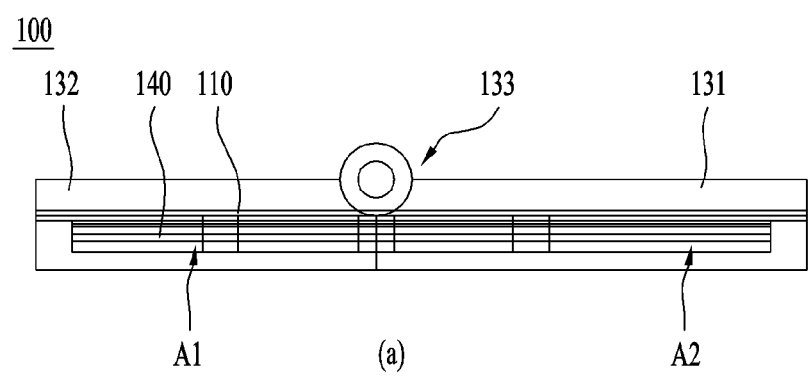
FIG. 5 is a cross-sectional view partially illustrating the unfolded state and the folded state of a folding region in the foldable display device shown in FIG. 2.
Figure 5:
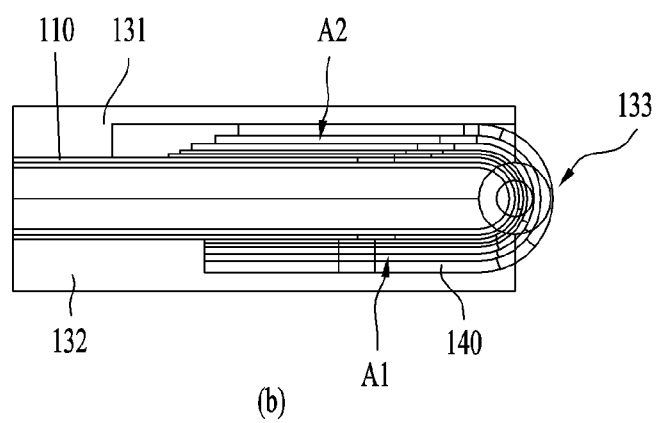

FIG. 3 is an enlarged perspective view illustrating an example of the sub-frame 140 of the foldable display device shown in FIG. 2. FIG. 4 is a bottom view partially illustrating the state in which the sub-frame 140 is coupled to the bottom surface of the lower plate in the foldable display device shown in FIG. 2. Further, (a) of FIG. 5 is a cross-sectional view partially illustrating the unfolded state of the foldable display device shown in FIG. 2, while (b) of FIG. 5 is a cross-sectional view partially illustrating the folded state of the foldable display device shown in FIG. 2. In the following description, the same reference numerals as those used above can preferably denote the same components.

Referring to FIGS. 3 to 5, the sub-frame 140 is coupled to the bottom surface of the lower plate 120 at a position corresponding to the position of the folding region 133 of the housing 130. Therefore, when the housing 130 is folded, the sub-frame 140 is also folded within the mounting region 134 of the housing 130 in accordance with the operation of folding the housing 130, and serves to shield the portion of the folding region 133 that becomes exposed to the outside. The sub-frame 140 is also formed to have a small thickness using a metal material. The sub-frame 140 and the lower plate 120 are welded to each other. Alternatively, the sub-frame 140 and the lower plate 120 can be coupled to each other using a fastener or an adhesive.

The sub-frame 140 is formed in a plate shape, and provides a predetermined elastic restoring force at a location between the lower plate 120 and the housing 130. Therefore, the display panel 110 or the housing 130 returns from the folded state to the unfolded state due to the elastic restoring force of the sub-frame 140.

The sub-frame 140 can have a structure in which multiple unit sub-layers having the same shape are stacked one on another. The sub-frame 140 can include a first unit sub-layer 141 which is disposed directly under the bottom surface of the lower plate 120, and a second unit sub-layer 142 which is disposed further outwards than the first unit sub-layer 141. The second unit sub-layer 142 can also include multiple unit sub-layers. The sub-frame 140 according to the embodiment of the present invention includes five layers, from the first unit sub-layer 141 to a fifth unit sub-layer 145.

As shown in FIG. 5, the sub-frame 140 includes a fixed region A1 fixed to the top surface of the second plate 132, and a slippage region A2 disposed on the top surface of the first plate 131 and in which, when the first plate 131 pivots relative to the second plate 132, the unit sub-layers slip relative to one another. In other words, when the sub-frame 140 is folded, the portions of the unit sub-layers that are located in the fixed region A1 are maintained in a fixed state, whereas the portions of the unit sub-layers that are located in the slippage region A2 slide (slip) relative to one another. The further the unit sub-layers are disposed outwards relative to the first unit sub-layer 141, the more the unit sub-layers slip.

The portions of the unit sub-layers that are located in the fixed region A1 of the sub-frame 140 are welded to one another, and the fixed region A1 is fixed to the bottom surface of the lower plate 120 and the top surface of the second plate 132. The fixed region A1 of the sub-frame 140 can be fixed by a coupling member that protrudes from any one of the bottom surface of the lower plate 120 and the top surface of the second plate 132. Each of the portions of the unit sub-layers that are located in the slippage region A2 of the sub-frame 140 includes a guide portion 147, which has therein a slot 146, through which a guide protrusion 122 protruding from the lower plate 120 or the housing 130 is inserted. Therefore, when the housing 130 is folded, each of the portions of the unit sub-layers that are located in the slippage region A2 of the sub-frame 140 is guided in the folding direction by the guide protrusion 122 inserted through the slot 146 in the guide portion 147. Further, when the housing 130 returns from the folded state to the unfolded state, the guide portion 147 is located adjacent to the guide protrusion 122 or is kept in contact with the guide protrusion 122, and thus the sub-frame 140 provides a predetermined tensile force to the lower plate 120, thereby improving the flatness of the display panel 110.

The sub-frame 140 has therein a hole pattern H/P that is the same as the hole pattern H/P in the lower plate 120. The hole pattern H/P in the sub-frame 140 can exhibit a heat dissipation function, like the hole pattern in the lower plate 120. Further, the elastic restoring force of the sub-frame 140 can be adjusted in accordance with the interval or size of holes, which constitute the hole pattern H/P.

As is apparent from the above description, the foldable display device according to the embodiments of the present invention has the following effects.

First, upon the folding operation, the sub-frame shields the folding region of the flexible display panel and the bottom surface of the folding region of the housing so as to prevent exposure thereof to the outside.

Second, since the sub-frame is formed by stacking multiple unit sub-layers formed of a metal material on one another, it can be used semi-permanently.

Third, the sub-frame is capable of providing restoring force by which the flexible display panel and the housing are effectively unfolded.

Lastly, when transitioning from the folded state to the unfolded state, the flatness of the flexible display panel is improved.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A foldable display device comprising:
   a display panel configured to be bent elastically;
   a lower plate coupled to a bottom surface of the display panel;
   a housing comprising a first plate for covering a portion of a bottom surface of the lower plate, a second plate for covering a remaining portion of the bottom surface of the lower plate, and a folding region defined by a hinge coupling between the first plate and the second plate; and
   a sub-frame disposed in the folding region to couple the lower plate onto the housing,
   wherein when the first plate and the second plate are folded, the sub-frame shields the folding region by being folded within the folding region in accordance with a folding of the first plate and the second plate,
   wherein the sub-frame comprises:
   a first unit sub-layer disposed under the bottom surface of the lower plate; and
   at least one second unit sub-layer disposed further outwardly than the first unit sub-layer;
   a fixed region fixed to a location between the lower plate and one of the first plate and the second plate; and
   a slippage region disposed at a location between the lower plate and a remaining one of the first plate and the second plate, and
   wherein when the housing is folded, a portion of the first unit sub-layer and a portion of the at least one second unit sub-layer that are located in the slippage region slip relative to each other.

2. The foldable display device according to claim 1, wherein the first unit sub-layer and the at least one second unit sub-layer are formed to have a same shape as each other, and have a same hole pattern such that holes formed in the first unit sub-layer and holes formed in the at least one second unit sub-layer communicate with each other.

3. The foldable display device according to claim 1, wherein the fixed region of the sub-frame is fixed to a location between the bottom surface of the lower plate and a top surface of the second plate,
   wherein the sub-frame comprises a guide portion disposed in the slippage region, the guide portion having therein a slot through which a guide protrusion protruding from one of the lower plate and the housing is inserted, and
   wherein, when the housing is folded, the sub-frame is guided in a folding direction by the guide protrusion inserted through the slot in the guide portion.

4. A foldable display device comprising:
   a display panel configured to be bent elastically;
   a lower plate coupled to a bottom surface of the display panel;
   a housing comprising a first plate for covering a portion of a bottom surface of the lower plate, a second plate for covering a remaining portion of the bottom surface of the lower plate, and a folding region defined by a hinge coupling between the first plate and the second plate; and
   a sub-frame disposed in the folding region to couple the lower plate onto the housing, wherein when the first plate and the second plate are folded, the sub-frame shields the folding region by being folded within the folding region in accordance with a folding of the first plate and the second plate,
   wherein the sub-frame comprises:
   a first unit sub-layer disposed under the bottom surface of the lower plate; and
   at least one second unit sub-layer disposed further outwardly than the first unit sub-layer, and
   wherein the first unit sub-layer and the at least one second unit sub-layer are formed to have a same shape as each other, and have a same hole pattern such that holes formed in the first unit sub-layer and holes formed in the at least one second unit sub-layer communicate with each other.

* * * * *